(12) United States Patent
Peiffer et al.

(10) Patent No.: US 7,132,876 B2
(45) Date of Patent: Nov. 7, 2006

(54) SYSTEM FOR DISCHARGING ELECTRONIC CIRCUITRY

(75) Inventors: Ronald J. Peiffer, Loveland, CO (US); Kevin L. Wible, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 136 days.

(21) Appl. No.: 11/023,893

(22) Filed: Dec. 28, 2004

(65) Prior Publication Data

US 2006/0139087 A1   Jun. 29, 2006

(51) Int. Cl.
*H03K 17/74* (2006.01)
(52) U.S. Cl. .................................. 327/423; 327/494
(58) Field of Classification Search ................ 327/92, 327/448, 494, 508, 587–588, 423
See application file for complete search history.

(56) References Cited

U.S. PATENT DOCUMENTS

| | | | | |
|---|---|---|---|---|
| 4,401,940 A | * | 8/1983 | Pospisil | 323/365 |
| 4,879,478 A | * | 11/1989 | Gershon | 327/92 |
| 5,572,154 A | * | 11/1996 | Rakers et al. | 327/92 |
| 5,945,822 A | * | 8/1999 | Shiotsuka | 324/158.1 |
| 6,211,723 B1 | * | 4/2001 | Creek | 327/494 |
| 6,861,893 B1 | * | 3/2005 | Kohsiek | 327/494 |

* cited by examiner

*Primary Examiner*—My-Trang Nuton

(57) ABSTRACT

An electronic discharge circuit. The discharge circuit includes a first current source having first current source input and output and a current control circuit having first, second, third, and fourth control contacts. An electronic circuit element of an electronic circuit has first and second element contacts. If first control contact and first current source input are electrically connected, second control contact and first current source output are electrically connected, third control contact and first element contact are electrically connected, and fourth control contact and second element contact are electrically connected, and if the electronic circuit element is electronically charged, current discharging the electronic circuit element is limited to the current from the first current source, otherwise when so connected, current discharging the electronic circuit element is zero and current from the first current source flows into the second control contact and out the first control contact.

20 Claims, 6 Drawing Sheets

SYSTEM FOR DISCHARGING ELECTRONIC CIRCUITRY

BACKGROUND

The unintended discharge of electronic circuitry is one of the most common causes of damage to board test systems. Often, a loaded printed circuit board being tested will have been powered up previously at some other point in the manufacturing process. An example of this situation is a printed circuit board that fails functional test or hot mockup and then is returned to board test for trouble-shooting.

Charge often remains on a capacitive component long after the source of power has been removed. If the board test system makes connection to the device under test (DUT) in such a way as to short out a charged capacitive element, much of the energy stored on that element is dissipated in the test system's relay contacts. The typical result of this situation is a welded relay causing a defect in the test system with associated increased warranty costs.

Current test systems discharge printed circuit board electronic circuitry through one of several different resistors located in the test system. The chosen resistor must be large enough to limit the current through the connecting relays to a safe level. The current approach is relatively slow. The discharge rate is determined by the time constant formed by the discharge resistor and the capacitance of the device under test. The resistor must be large enough to limit the discharge current to a safe level under worst case voltage conditions. The magnitude of the discharge current decreases as the capacitor is discharged. As such, the discharge rate is not as fast as could be obtained if a constant current were used. So to speed things up, lower valued resistors are switched in as the voltage at the terminals of the electronic circuitry decreases. However, the time necessary to switch in the smaller resistors is not insignificant.

In addition, the very act of discharging a capacitive element of the electronic circuitry of the printed circuit board may recharge a capacitive element of the electronic circuitry that had been previously discharged. As an example, consider a printed circuit board having three capacitors that are connected in a delta network with each capacitor containing some charge and with each connection point between two of the capacitors being a test point. One of the capacitors in the delta network can be discharged such that the voltage across the capacitor and the charge held by it are reduced to zero. The voltage across the series combination of the other two capacitors is also zero. But, the voltage and the charge on each to the series combination capacitors taken individually is not. If a second capacitor in the delta network is subsequently discharged, the voltage and charge on this capacitor will be forced to zero. But, some of the charge on the third capacitor will be transferred back to the first capacitor, i.e., to the capacitor that had previously been discharged. Because of the "charge transfer" problem just described, it may be necessary to repeat the discharge cycle until all capacitors are found to be at a safe voltage level.

In order to discharge a particular device under test in a reasonable length of time, it may be necessary to limit the discharge to only those nodes capable of damaging the test system. In some test systems, as for example the Agilent 3070, a software program analyzes capacitor sizes and power supply voltages to determine which capacitors need to be discharged and which do not. The accuracy of this analysis is dependant upon the accuracy of data entered by the customer and whether or not the customer consistently updates the data as changes are made in the board's design. This process is quite prone to error, and if the customer makes a mistake, the test system manufacturer often pays for damage to the test system, either through higher warranty costs or in the higher cost of providing a service contract. In addition, this method is complex. The test system manufacturer must write and support a great deal of software in providing this feature. In addition, the customer must be trained in how to use this feature and must spend time supporting it whenever a change is made to the printed circuit board design.

SUMMARY

In a representative embodiment, an electronic discharge circuit comprises a first current source having a first current source input and a first current source output and comprises a current control circuit having a first, a second, a third, and a fourth control contacts. An electronic circuit element of an electronic circuit has a first and a second element contacts. If the first control contact is electrically connected to the first current source input, the second control contact is electrically connected to the first current source output, the third control contact is electrically connected to the first element contact, and the fourth control contact is electrically connected to the second element contact, and if the electronic circuit element is electronically charged, current discharging the electronic circuit element is limited to the current from the first current source. Otherwise when so connected, current discharging the electronic circuit element is zero and current from the first current source flows into the second control contact and out the first control contact.

In another representative embodiment, an electronic discharge circuit for removing charge from an electronic circuit, comprises a first current source having a first current source input and a first current source output, a second current source having a second current source input and a second current source output, and a current control circuit having a first, a second, a third, and a fourth control contacts. The electronic circuit comprises an electronic circuit element, and the electronic circuit element comprises a first and a second element contacts. If the first current source input is electrically connected to the second current source output, the first control contact is electrically connected to the second current source input, the second control contact is electrically connected to the first current source output, the third control contact is electrically connected to the first element contact, the third control contact is electrically connected to the first current source input, the third control contact is electrically connected to the second current source output, and the fourth control contact is electrically connected to the second element contact, and if the electronic circuit element is positively charged, current discharging the electronic circuit element is limited to the current from the second current source. Otherwise if the electronic circuit element is negatively charged, current discharging the electronic circuit element is limited to the current from the first current source. Otherwise when so connected, current discharging the electronic circuit element is zero and current from the first current source flows in a loop into the second control contact, out the first control contact, through the second current source, and back to the first current source.

Other aspects and advantages of the representative embodiments presented herein will become apparent from the following detailed description, taken in conjunction with the accompanying drawings.

BRIEF DESCRIPTION OF THE DRAWINGS

The accompanying drawings provide visual representations which will be used to more fully describe various representative embodiments and can be used by those skilled in the art to better understand them and their inherent advantages. In these drawings, like reference numerals identify corresponding elements.

DETAILED DESCRIPTION

Figure 1:
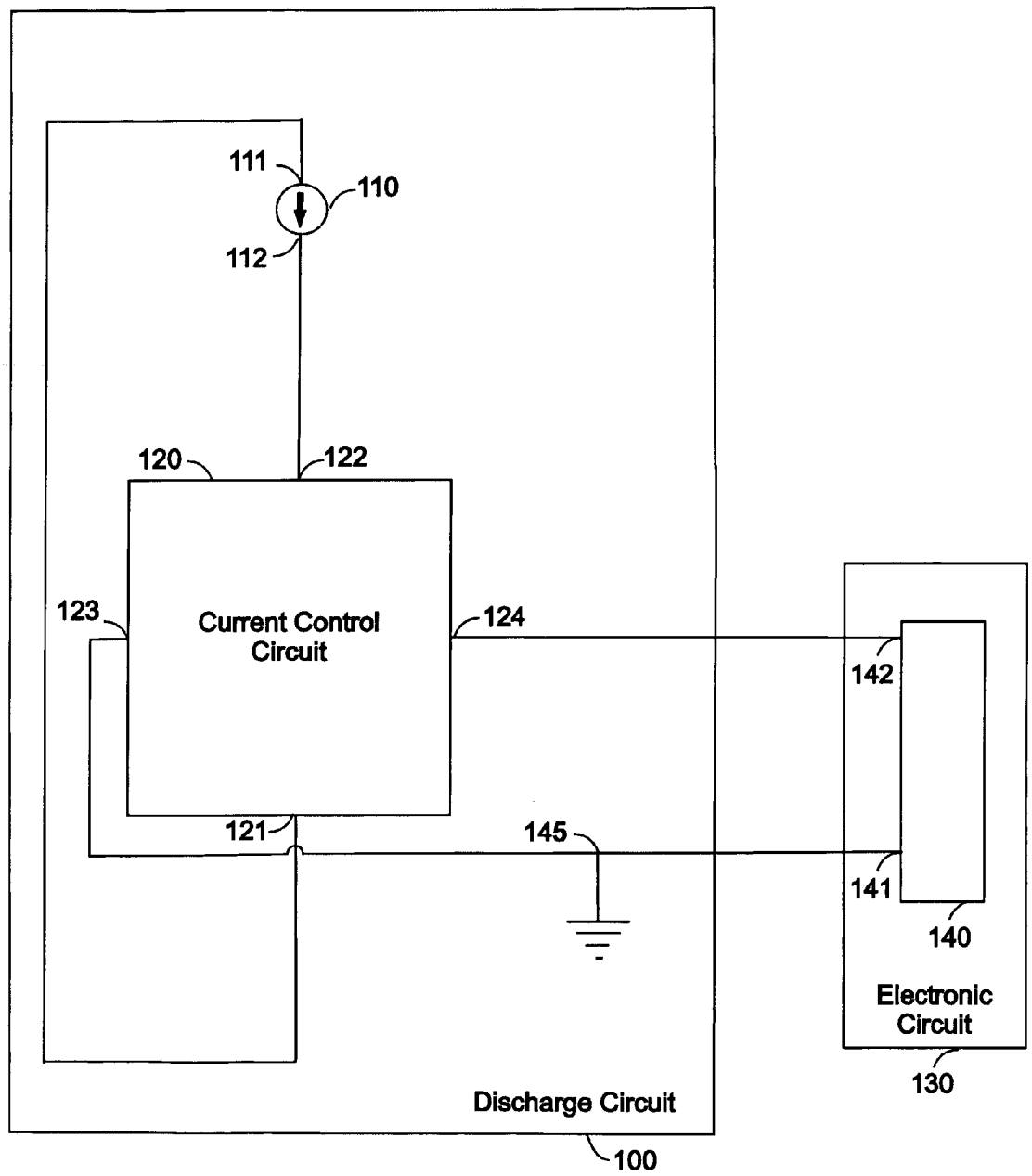
FIG. 1 is a block diagram of an electronic discharge circuit as described in various representative embodiments.

As shown in the drawings for purposes of illustration, the present patent document discloses novel techniques for discharging electronic circuitry. Previous techniques for discharging electronic circuitry, for example electronic circuitry on a loaded printed circuit board, often result in slower than desired discharge times. Present techniques can also result in the recharge of capacitive elements as other circuitry is discharged.

Thus, it is desirable to provide a system for the discharge of electronic circuitry which has a faster discharge rate and which does not have to be discharged multiple times in order to remove the charge from the circuitry elements.

In the following detailed description and in the several figures of the drawings, like elements are identified with like reference numerals.

FIG. 1 is a block diagram of an electronic discharge circuit 100 as described in various representative embodiments. The electronic discharge circuit 100 is also referred to herein as discharge circuit 100. In the representative embodiment of FIG. 1, the discharge circuit 100 comprises a first current source 110 and a current control circuit 120. The first current source 110 has a first current source input 111 and a first current source output 112. The current control circuit 120 has a first control contact 121, a second control contact 122, a third control contact 123, and a fourth control contact 124.

The first current source input 111 is connected to the first control contact 121, and the first current source output 112 is connected to the second control contact 122. The third control contact 123 and the fourth control contact 124 of the current control circuit 120 are attachable to an electronic circuit element 140 of an electronic circuit 130.

The electronic circuit element 140 may comprise one or more devices, discrete or distributed, which are capable of storing an electrical charge for some period of time. If appropriate contact points are accessible, the discharge circuit 100 can be used to discharge any charge which might remain in the electronic circuit element 140 from a previous operation. The electronic circuit element 140 shown in FIG. 1 has a first element contact 141, also referred to herein as a reference node 141, and a second element contact 142, also referred to herein as an element node 142, which are attachable to the discharge circuit 100. The reference node 141 is attachable to the third control contact 123, and the element node 142 is attachable to the fourth control contact 124. The electronic circuit 130 may comprise multiple electronic circuit elements 140, only one of which is shown in FIG. 1, which may be successively discharged by the discharge circuit 100 as will be described in the following. The third control contact 123 of the current control circuit 120 and the second element contact 141 of the electronic circuit element 140 can be attached to a reference potential which could be, for example, ground potential as shown in FIG. 1 at first electrical contact point 145, also referred to herein as a reference contact point 145.

Figure 2:
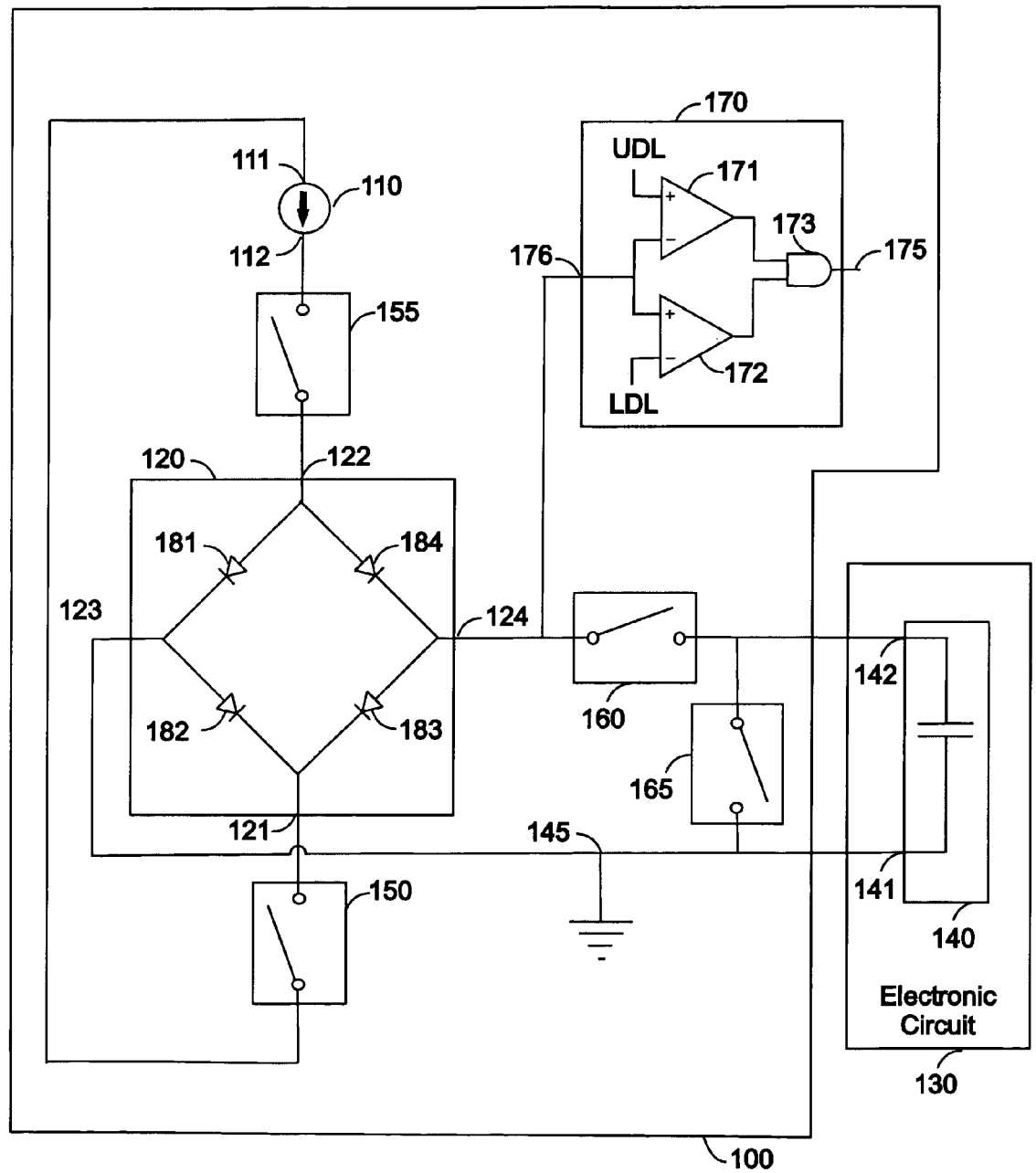
FIG. 2 is a block diagram of another electronic discharge circuit as described in various representative embodiments.

FIG. 2 is a block diagram of another electronic discharge circuit 100 as described in various representative embodiments. In the representative embodiment of FIG. 2, the current control circuit 120 comprises a first diode 181, a second diode 182, a third diode 183, and a fourth diode 184. The anode of the first diode 181 is connected to the second control contact 122, and the cathode of the first diode 181 is connected to the third control contact 123. The anode of the second diode 182 is connected to the third control contact 123, and the cathode of the second diode 182 is connected to the first control contact 121. The anode of the third diode 183 is connected to the fourth control contact 124, and the cathode of the third diode 183 is connected to the first control contact 121. The anode of the fourth diode 184 is connected to the second control contact 122, and the cathode of the fourth diode 184 is connected to the fourth control contact 124. The discharge circuit 100 of FIG. 2 further comprises a first switch 150, a second switch 155, a third switch 160, and a fourth switch 165. The first, second, third, and fourth switches 150,155,160,165 are used in transferring the discharge circuit 100 from discharging one electronic circuit element 140 in the electronic circuit 130 to discharging another electronic circuit element 140, as well as in maintaining the discharge condition of any given electronic circuit element 140 once it has been discharged. The use of the first, second, third, and fourth switches 150,155,160,165 is optional. First, second, third, and fourth switches 150, 155,160,165 are also useful in transferring the discharge circuit 100 from one electronic circuit 130 to another electronic circuit 130. First, second, third, and fourth switches 150,155,160,165 could also be first, second, third, and fourth relays 150,155,160,165 and could further be located on a test head of a printed circuit board test machine.

In FIG. 2, the first switch 150 is connected between the first current source input 111 and the first control contact 121; the second switch 155 is connected between the first current source output 112 and the second control contact 122; the third switch 160 is connected between the element node 142 and the fourth control contact 124; and the fourth switch 165 is connected between the reference node 141 and the element node 142. The third control contact 123 is connected the reference node 141.

Each of the switches 150,155,160,165 has an open and a closed position. If the first switch 150 is in its closed position, the first current source input 111 is electrically connected to the first control contact 121, otherwise, the first switch 150 is in its open position and the first current source input 111 is electrically disconnected from the first control contact 121. If the second switch 155 is in its closed position, the first current source output 112 is electrically connected to the second control contact 122, otherwise, the second switch 155 is in its open position and the first current source output 112 is electrically disconnected from the second control contact 122. If the third switch 160 is in its closed position, the element node 142 is electrically connected to the fourth control contact 124 otherwise, the third switch 160 is in its open position and the element node 142 is electrically disconnected from the fourth control contact 124. If the fourth switch 165 is in its closed position, the reference node 141 is electrically connected to the element node 142 otherwise, the fourth switch 165 is in its open position and the reference node 141 is electrically disconnected, external to the electronic circuit element 140 and the electronic circuit 130, from the element node 142.

A detection circuit 170 can optionally be connected to the fourth control contact 124 which, if the third switch 160 is closed, is connected to the element node 142. In a representative embodiment, the detection circuit 170 comprises a detection circuit input 176 and a first and a second comparators 171,172 each having a positive and a negative inputs indicated by the positive and the negative algebraic signs in FIG. 2. The detection circuit 170 further comprises an AND circuit 173 having an AND-circuit output 175, also referred to herein as detection circuit output 175, and having one of its inputs connected to the output of the first comparator 171 and the other input connected to the output of the second comparator 172. The positive input of the first comparator 171 is connected to an upper discharge limit reference potential UDL, and the negative input of the first comparator 171 is connected to the fourth control contact 124 via detection circuit input 176. The positive input of the second comparator 172 is connected to the fourth control contact 124 via detection circuit input 176, and the negative input of the second comparator 172 is connected to a lower discharge limit reference potential LDL. Placing the third switch 160 in its closed position connects the element node 142 to the detection circuit input 176. If now the charge held by the electronic circuit element 140 is such that the voltage at the element node 142 is less than the lower discharge limit reference potential LDL, the detection circuit output 175 will be a "0", and if the charge held by the electronic circuit element 140 is such that the voltage at the element node 142 is greater than the upper discharge limit reference potential UDL, the detection circuit output 175 will again be a "0". However, if the charge held by the electronic circuit element 140 is such that the voltage at the element node 142 is less than the upper discharge limit reference potential UDL and is greater than the lower discharge limit reference potential LDL, the detection circuit output 175 will then be a "1" indicating that the electronic circuit element 140 has reached an acceptable level of discharge and that the fourth switch 165 can be safely closed.

For the typical case in which the electronic circuit 130 comprises multiple electronic elements 140, the electronic discharge circuit 100 can optionally comprise multiple third switches 160 and multiple fourth switches 165. For this representative embodiment, each third switch 160 is paired with a fourth switch 165, and each pair of third and fourth switches 160,165 is associated with one of the electronic circuit elements 140. Alternatively, each pair of third and fourth switches 160,165 can be referred to as associated with a particular node rather than to a particular electronic circuit element 140. Note that each electronic circuit element 140 may, in fact, comprise multiple electronic devices on the electronic circuit 130. What is shown in the figures as electronic circuit element 140 comprises all electronic devices and conducting paths between the element node 142 and the reference node 141. Each third switch 160 is connected between the element node 142 of the associated electronic circuit element 140 and the fourth control contact 124. If one of the third switches 160 is in its closed position, the element node 142 of the associated electronic circuit element 140 is electrically connected to the fourth control contact 124 otherwise, the third switch 160 is in its open position and the element node 142 of the associated electronic circuit element 140 is electrically disconnected from the fourth control contact 124. Each paired fourth switch 165 is connected between the reference node 141 of the associated electronic circuit element 140 and the element node 142 of the associated electronic circuit element 140. If the fourth switch 165 of the associated electronic circuit element 140 is in its closed position, the reference node 141 of the associated electronic circuit element 140 is electrically connected to the element node 142 of the associated electronic circuit element 140 otherwise, the fourth switch 165 of the associated electronic circuit element 140 is in its open position and the reference node 141 of the associated electronic circuit element 140 is electrically disconnected from the element node 142 of the associated electronic circuit element 140.

In a typical method of operating the representative embodiment of FIG. 2, the initial state of the discharge circuit 100 has the first, second, third, and fourth switches 150,155,160,165 in their open positions. Then the third switch 160 is closed which results in the connection of the element node 142 to the fourth control contact 124. If the element node 142 is positively charged with respect to the reference node 141, discharge of the electronic circuit element 140 will be blocked by second and fourth diodes 182,184. In contrast, if the element node 142 is negatively charged with respect to the reference node 141, discharge of the electronic circuit element 140 will be blocked by first and third diodes 181,183. The first current source 110 is then connected to the current control circuit 120 by closing the first and second switches 150,155 at which time the discharge circuit 100 begins to remove any charge on the electronic circuit element 140. Once any charge between the element node 142 and the reference node 141 is removed or discharged the fourth switch 165 is closed, thereby shorting the element node 142 to the reference node 141 and holding the potential of the element node 142 to that of the reference node 141. Thus, if the potential of the reference contact point 145 is at ground potential, the potential of the element node 142 is then held at ground potential by the shorting of the fourth switch 165. Then the first current source 110 is disconnected from the current control circuit 120 by opening the first and second switches 150,155. The fourth control contact 124 of the current control circuit 120 is then disconnected from the electronic circuit element 140 at the element node 142 by opening the third switch 160. Charge which may be on other electronic circuit elements 140 can then be discharged by separately closing in sequence the third switch 160 associated each of the other electronic circuit elements 140 and performing the above steps. After each electronic circuit element 140 (each element node 142 is discharged with respect to the previously selected reference node 141 of the electronic circuit 130) is discharged, its associated fourth switch 165 is left in the closed position, thereby preventing the recharging of that element node 142 by the subsequent discharge of other electronic circuit elements 140, as would occur in the case of the three capacitors connected in a delta network with each capacitor containing some charge and with each connection point between two of the capacitors being a test point.

Figure 3:
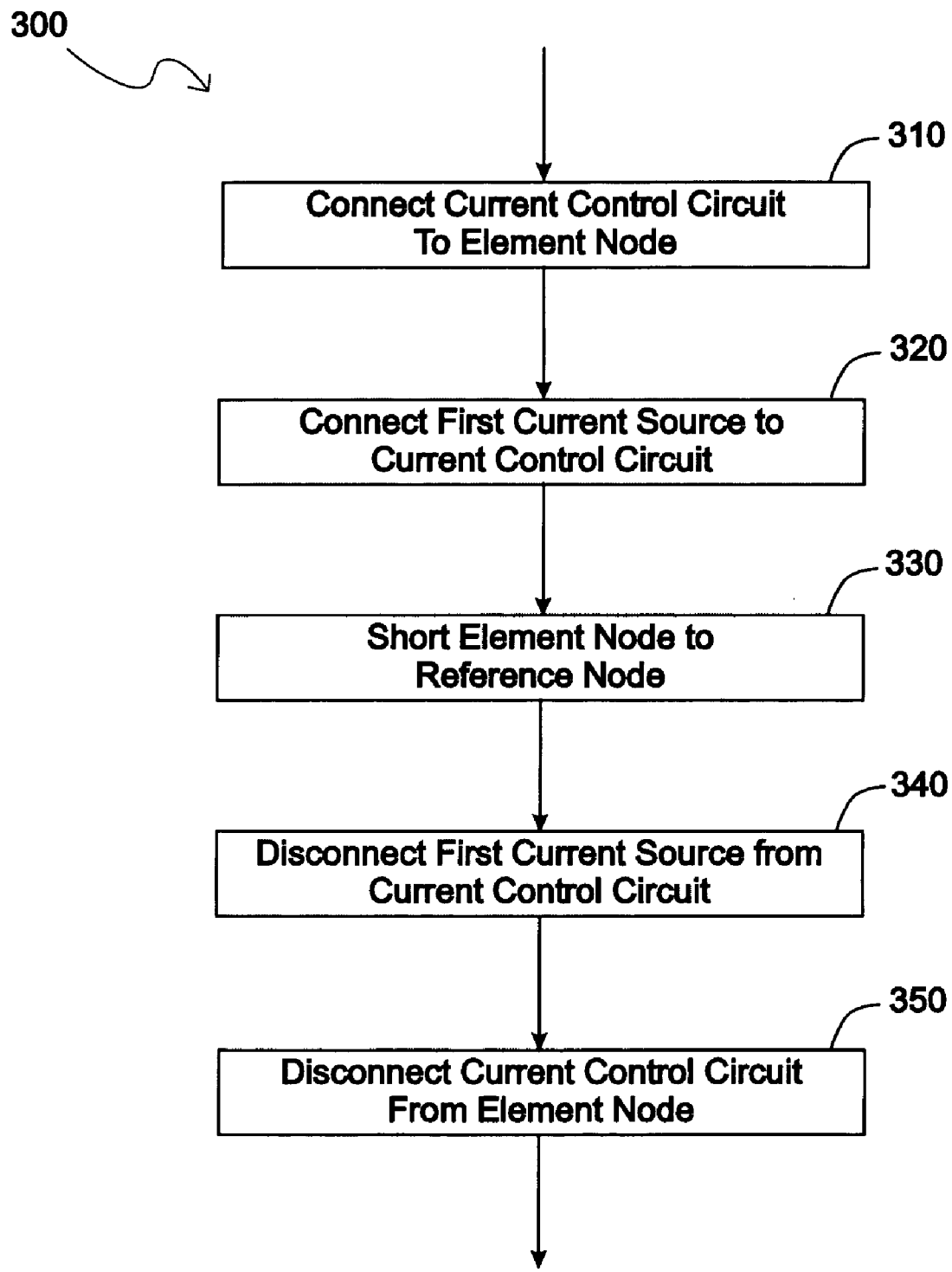
FIG. 3 is a flow chart of a method for removing charge from circuit elements using an electronic discharge circuit as described in various representative embodiments.

FIG. 3 is a flow chart 300 of a method for removing charge from electronic circuit elements 140 using an electronic discharge circuit 100 as described in various representative embodiments. This flow chart mirrors the method just described with respect to FIG. 2, wherein the initial state of the discharge circuit 100 has the first, second, third, and fourth switches 150,155,160,165 in their open positions. In block 310 of FIG. 3, the current control circuit 120 is connected to the element node 142. This step could be effected, as described above, by closing the third switch 160 of FIG. 2 which results in the connection of the element node 142 to the fourth control contact 124. Block 310 then transfers control to block 320.

In block 320, the first current source 110 is connected to the current control circuit 120, as for example by closing the first and second switches 150,155 at which time the discharge circuit 100 begins to remove any charge on the electronic circuit element 140. Once any charge between the element node 142 and the reference node 141 is removed or discharged (i.e., the voltage goes to zero or within the specified upper discharge limit reference potential UDL and lower discharge limit reference potential LDL limits), block 320 then transfers control to block 330.

In block 330, the element node 142 is shorted to the reference node 141 thereby holding the potential of the element node 142 to that of the reference node 141. The shorting of the element node 142 to the reference node 141 could be effected by closing the fourth switch 165. If the potential of the reference contact point 145 is at ground potential, the potential of the element node 142 is then held at ground potential by the shorting of the fourth switch 165. Block 330 then transfers control to block 340.

In block 340, the first current source 110 is disconnected from the current control circuit 120. The disconnecting of the first current source 110 from the current control circuit 120 could be effected by opening the first and second switches 150,155. Block 340 then transfers control to block 350.

In block 350, the current control circuit 120 is disconnected from the electronic circuit element 140 at the element node 142. The disconnecting of the current control circuit 120 from the electronic circuit element 140 could be effected by opening the third switch 160. Block 350 then terminates the process for that electronic circuit element 140.

Charge which may be on other electronic circuit elements 140 can then be removed by repeating the above process steps for each electronic circuit element 140 of interest. As described above with respect to FIG. 2, after each electronic circuit element 140 is discharged, its element node 142 is preferably left shorted to its reference node 141, thereby preventing the recharging of that element node 142 by the subsequent discharge of other electronic circuit elements 140, as would occur in the case of the three capacitors connected in a delta network with each capacitor containing some charge and with each connection point between two of the capacitors being a test point.

The above procedures provide the capability of never switching a switch or relay hot, thereby increasing switch or relay contact life and protection. Also, multiple discharge circuits may be applied to different nodes at the same time so that multiple nodes may be discharged concurrently, thereby enhancing throughput. Special consideration should be given to those electronic circuits 130 that contain batteries, as only one of the battery nodes may be discharged, and further the test should avoid significant battery discharge. Preferably the nodes that should not be discharged should be identified prior to the discharge process. Those nodes can be omitted from or commented out of the test program.

Figure 4:
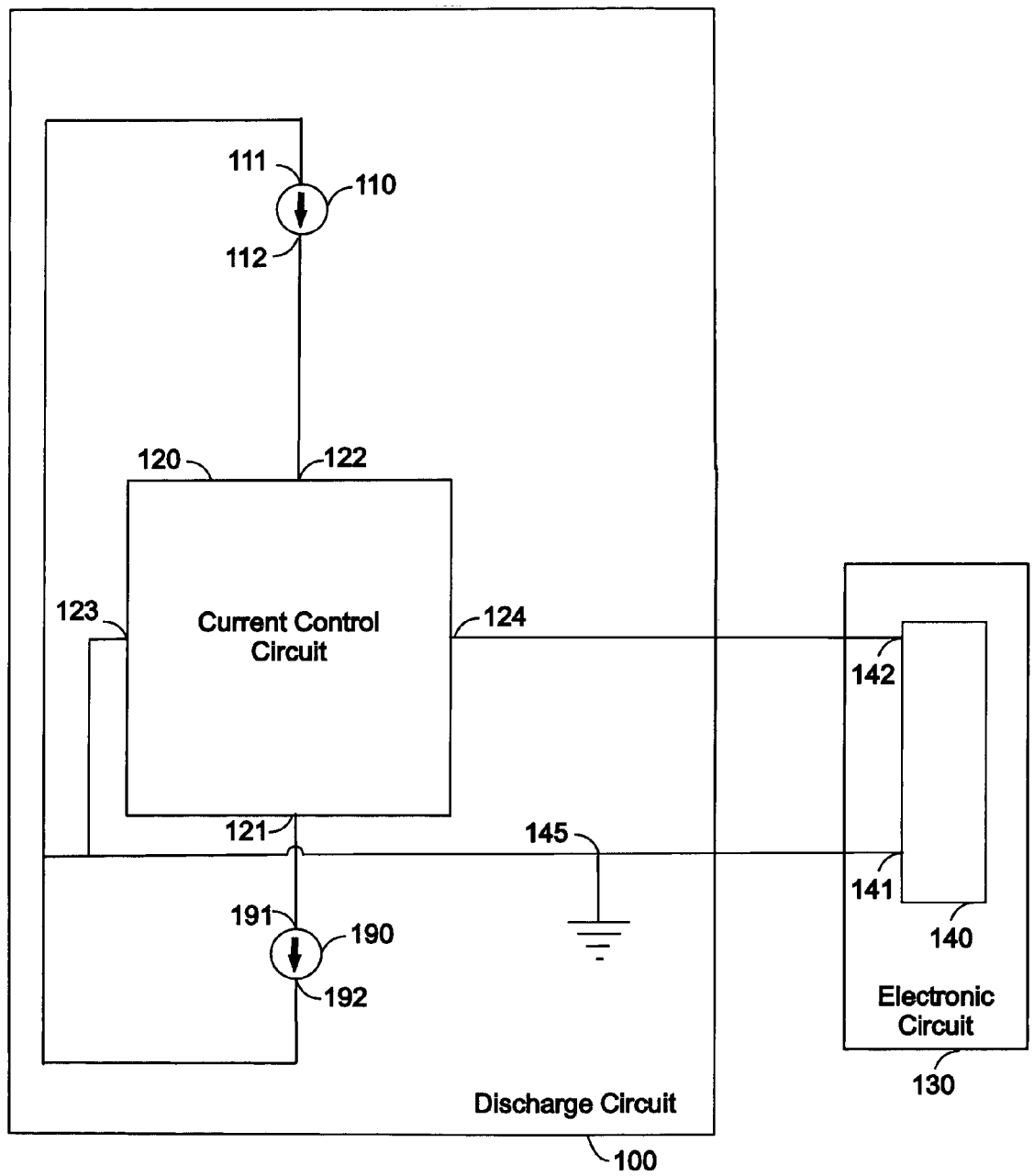
FIG. 4 is a block diagram of yet another electronic discharge circuit as described in various representative embodiments.

FIG. 4 is a block diagram of yet another electronic discharge circuit 100 as described in various representative embodiments. In the representative embodiment of FIG. 4, the discharge circuit 100 comprises a first current source 110, a current control circuit 120, and a second current source 190. The first current source 110 has a first current source input 111 and a first current source output 112. The current control circuit 120 has a first control contact 121, a second control contact 122, a third control contact 123, and a fourth control contact 124. The second current source 190 has a second current source input 191 and a second current source output 192.

The first current source input 111 is connected to the second current source output 192, and the first current source output 112 is connected to the second control contact 122. The second current source output 192 is connected to the first current source input 111 and to the third control contact 123. The second current source input 191 is connected to the first control contact 121. The third control contact 123 and the fourth control contact 124 of the current control circuit 120 are attachable to an electronic circuit element 140 of an electronic circuit 130.

As with FIG. 1, the electronic circuit element 140 may comprise one or more devices, discrete or distributed, which are capable of storing an electrical charge for some period of time. If appropriate contact points are accessible, the discharge circuit 100 can be used to discharge any charge which might remain in the electronic circuit element 140 from a previous operation. The electronic circuit element 140 shown in FIG. 4 has its reference node 141 attached to the third control contact 123, and its element node 142 attached to the fourth control contact 124. Again, the electronic circuit 130 may comprise multiple electronic circuit elements 140, only one of which is shown in FIG. 4, which may be successively discharged by the discharge circuit 100. The third control contact 123 of the current control circuit 120 and the first element contact 141 of the electronic circuit element 140 may either be allowed to float or may be optionally attached to a reference potential which could be, for example, ground potential as is shown in FIG. 4 at reference contact point 145.

Figure 5:
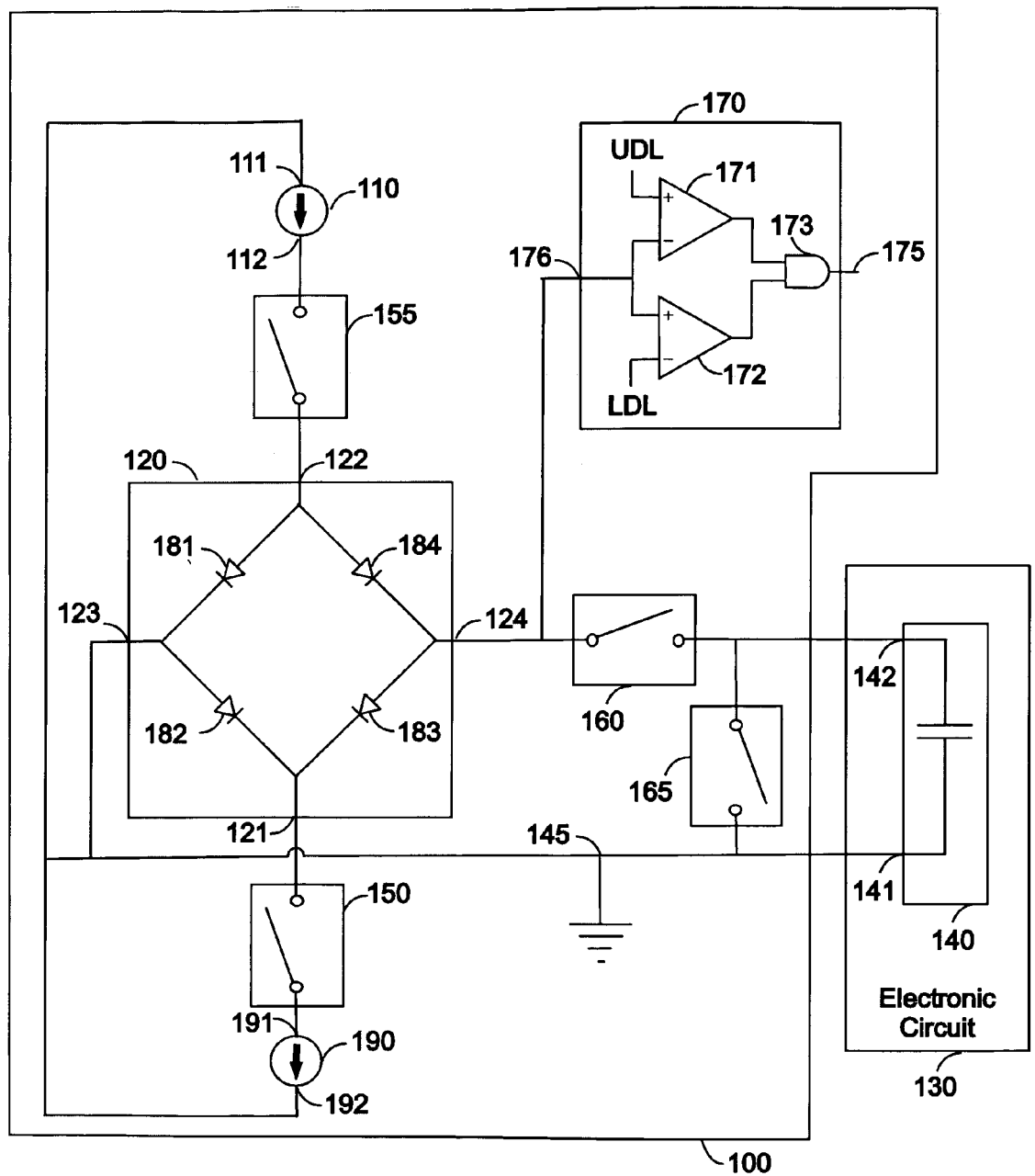
FIG. 5 is a block diagram of still another electronic discharge circuit as described in various representative embodiments.

FIG. 5 is a block diagram of still another electronic discharge circuit 100 as described in various representative embodiments. In the representative embodiment of FIG. 5, the current control circuit 120 comprises a first diode 181, a second diode 182, a third diode 183, and a fourth diode 184. The anode of the first diode 181 is connected to the second control contact 122, and the cathode of the first diode 181 is connected to the third control contact 123. The anode of the second diode 182 is connected to the third control contact 123, and the cathode of the second diode 182 is connected to the first control contact 121. The anode of the third diode 183 is connected to the fourth control contact 124, and the cathode of the third diode 183 is connected to the first control contact 121. The anode of the fourth diode 184 is connected to the second control contact 122, and the cathode of the fourth diode 184 is connected to the fourth control contact 124. The discharge circuit 100 of FIG. 5 further comprises a first switch 150, a second switch 155, a third switch 160, and a fourth switch 165. The first, second, third, and fourth switches 150,155,160,165 are used in transferring the discharge circuit 100 from discharging one electronic circuit element 140 in the electronic circuit 130 to discharging another electronic circuit element 140, as well as in maintaining the discharge condition of any given electronic circuit element 140 once it has been discharged. The use of the first, second, third, and fourth switches 150,155,160,165 is optional. First, second, third, and fourth switches 150, 155,160,165 are also useful in transferring the discharge circuit 100 from one electronic circuit 130 to another electronic circuit 130. First, second, third, and fourth switches 150,155,160,165 could also be first, second, third, and fourth relays 150,155,160,165 and could further be located in a test head of a printed circuit board test machine. The discharge circuit further comprises the first current source 110 having first current source input 111 and first current source output 112 and the second current source 190 having second current source input 191 and second current source output 192.

In FIG. 5, the first switch 150 is connected between the second current source input 191 and the first control contact 121; the second switch 155 is connected between the first current source output 112 and the second control contact 122; the third switch 160 is connected between the element node 142 and the fourth control contact 124; and the fourth switch 165 is connected between the reference node 141 and the element node 142. The first current source input 111 is connected to the second current source output 192, to the third control contact 123, and to the reference node 141 via reference contact point 145. Reference contact point 145 may, in fact, not be a single point but may be a distributed conductor or set of conductive elements at the same potential which in FIG. 5 is shown as the ground potential.

Each of the switches 150,155,160,165 has an open and a closed position. If the first switch 150 is in its closed position, the second current source input 191 is electrically connected to the first control contact 121, otherwise, the first switch 150 is in its open position and the second current source input 191 is electrically disconnected from the first control contact 121. If the second switch 155 is in its closed position, the first current source output 112 is electrically connected to the second control contact 122, otherwise, the second switch 155 is in its open position and the first current source output 112 is electrically disconnected from the second control contact 122. If the third switch 160 is in its closed position, the element node 142 is electrically connected to the fourth control contact 124 otherwise, the third switch 160 is in its open position and the element node 142 is electrically disconnected from the fourth control contact 124. If the fourth switch 165 is in its closed position, the reference node 141 is electrically connected to the element node 142 otherwise, the fourth switch 165 is in its open position and the reference node 141 is electrically disconnected, external to the electronic circuit element 140 and the electronic circuit 130, from the element node 142.

The detection circuit 170 can optionally be connected to the fourth control contact 124 which, if the third switch 160 is closed, is connected to the element node 142. In a representative embodiment, the detection circuit 170 comprises the detection circuit input 176 and first and second comparators 171,172 each having positive and negative inputs indicated by the positive and the negative algebraic signs in FIG. 5. The detection circuit 170 further comprises the AND circuit 173 having the AND-circuit output 175 and having one of its inputs connected to the output of the first comparator 171 and the other input connected to the output of the second comparator 172. The positive input of the first comparator 171 is connected to an upper discharge limit reference potential UDL, and the negative input of the first comparator 171 is connected to the fourth control contact 124 via detection circuit input 176. The positive input of the second comparator 172 is connected to the fourth control contact 124 via detection circuit input 176, and the negative input of the second comparator 172 is connected to a lower discharge limit reference potential LDL. Placing the third switch 160 in its closed position connects the element node 142 to the detection circuit input 176. If now the charge held by the electronic circuit element 140 is such that the voltage at the element node 142 is less than the lower discharge limit reference potential LDL, the detection circuit output 175 will be a "0", and if the charge held by the electronic circuit element 140 is such that the voltage at the element node 142 is greater than the upper discharge limit reference potential UDL, the detection circuit output 175 will again be a "0". However, it the charge held by the electronic circuit element 140 is such that the voltage at the element node 142 is less than the lower discharge limit reference potential LDL and is greater than the upper discharge limit reference potential UDL, the detection circuit output 175 will then be a "1" indicating that the electronic circuit element 140 has reached an acceptable level of discharge and that the fourth switch 165 can be safely closed.

For the typical case in which the electronic circuit 130 comprises multiple electronic circuit elements 140, the electronic discharge circuit 100 can optionally comprise multiple third switches 160 and multiple fourth switches 165. For this representative embodiment, each third switch 160 is paired with a fourth switch 165, and each pair of third and fourth switches 160,165 is associated with one of the electronic circuit elements 140. Alternatively, each pair of third and fourth switches 160,165 can be referred to as associated with a particular node rather than to a particular electronic circuit element 140. Note that each electronic circuit element 140 may, in fact, comprise multiple electronic devices on the electronic circuit 130. What is shown in the figures as electronic circuit element 140 comprises all electronic devices and conducting paths between the element node 142 and the reference node 141. Each third switch 160 is connected between the element node 142 of the associated electronic circuit element 140 and the fourth control contact 124. If one of the third switches 160 is in its closed position, the element node 142 of the associated electronic circuit element 140 is electrically connected to the fourth control contact 124 otherwise, the third switch 160 is in its open position and the element node 142 of the associated electronic circuit element 140 is electrically disconnected from the fourth control contact 124. Each paired fourth switch 165 is connected between the reference node 141 of the associated electronic circuit element 140 and the element node 142 of the associated electronic circuit element 140. If the fourth switch 165 of the associated electronic circuit element 140 is in its closed position, the reference node 141 of the associated electronic circuit element 140 is electrically connected to the element node 142 of the associated electronic circuit element 140 otherwise, the fourth switch 165 of the associated electronic circuit element 140 is in its open position and the reference node 141 of the associated electronic circuit element 140 is electrically disconnected from the element node 142 of the associated electronic circuit element 140.

In a typical method of operating the representative embodiment of FIG. 5, the initial state of the discharge circuit 100 has the first, second, third, and fourth switches 150,155,160,165 in their open positions. The n the third switch 160 is closed which results in the connection of the element node 142 to the fourth control contact 124. If the element node 142 is positively charged with respect to the reference node 141, discharge of the electronic circuit element 140 will be blocked by second and fourth diodes 182,184. In contrast, if the element node 142 is negatively charged with respect to the reference node 141, discharge of the electronic circuit element 140 will be blocked by first and third diodes 181,183. The first and second current sources 110,190 are then connected to the current control circuit 120 by closing the first and second switches 150,155 at which time the discharge circuit 100 begins to remove any charge on the electronic circuit element 140. Once any charge between the element node 142 and the reference node 141 is removed or discharged the fourth switch 165 is closed, thereby shorting the element node 142 to the reference node 141 and holding the potential of the element node 142 to that of the reference node 141. Thus, if the potential of the reference contact point 145 is at ground potential, the potential of the element node 142 is then held at ground potential by the shorting of the fourth switch 165. Then the first current source 110 is disconnected from the current control circuit 120 at the second control contact 122 by opening the second switch 155, and the second current source 190 is disconnected from the current control circuit 120 at the first control contact 121 by opening the first switch 150. The fourth control contact 124 of the current control circuit 120 is then disconnected from the electronic circuit element 140 at the element node 142 by opening the third switch 160. Charge which may be on other electronic circuit elements 140 can then be discharged by separately closing in sequence the third switch 160 associated each of the other electronic circuit elements 140 and performing the above steps. After each electronic circuit element 140 is discharged (each element node 142 is discharged with respect to the previously selected reference node 141 of the electronic circuit 130), its associated fourth switch 165 is left in the closed position, thereby preventing the recharging of that element node 142 by the subsequent discharge of other electronic circuit elements 140, as would occur in the case of the three capacitors connected in a delta network with each capacitor containing some charge and with each connection point between two of the capacitors being a test point.

A method similar to that discussed with respect to the flow chart 300 of FIG. 3 can be followed in removing charge from electronic circuit elements 140 using an electronic discharge circuit 100 as described in various representative embodiments of FIGS. 4 and 5.

Figure 6:
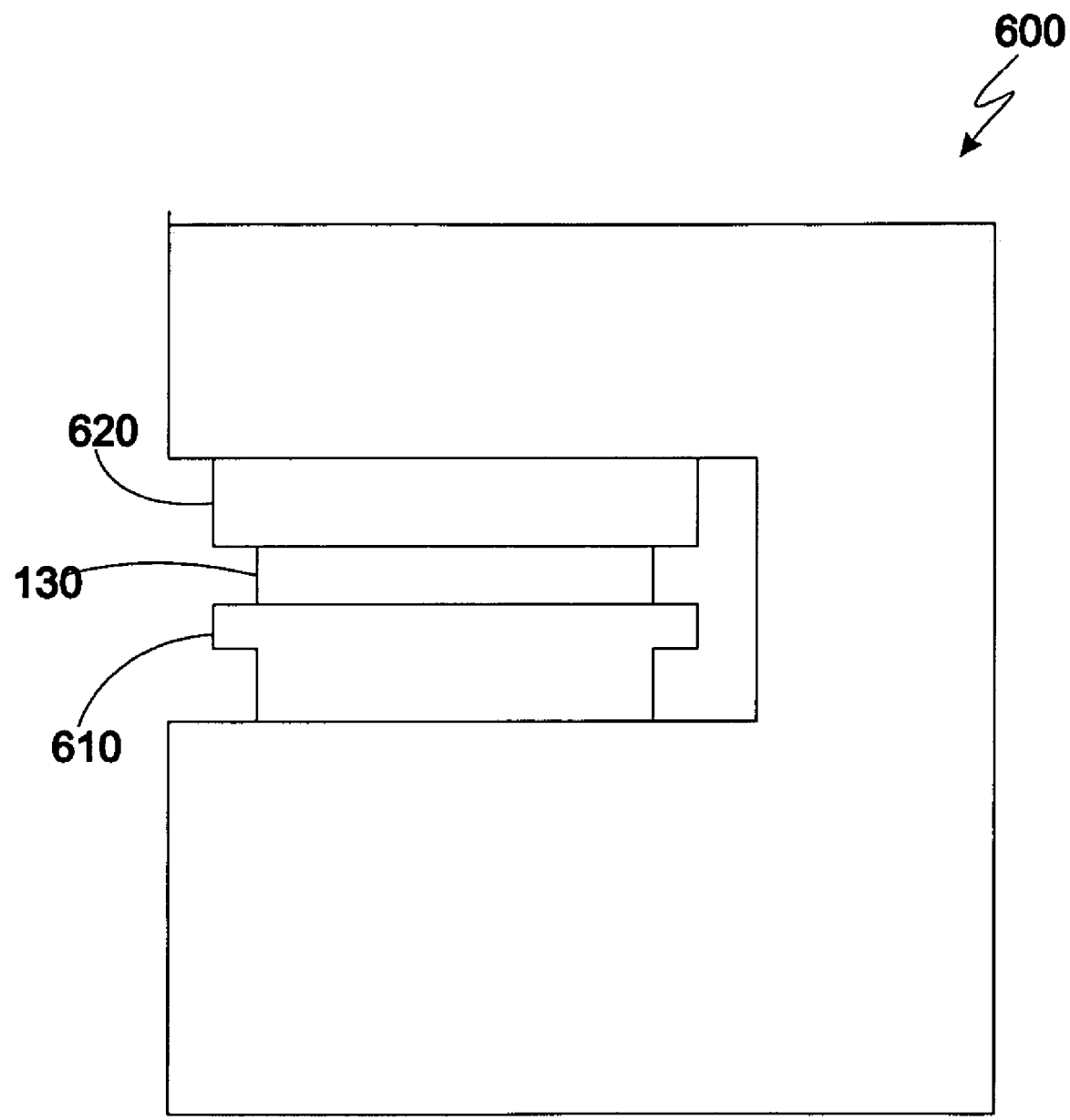
FIG. 6 is a drawing of an electronic test system as described in various representative embodiments.

FIG. 6 is a drawing of an electronic test system 600 as described in various representative embodiments. In FIG. 6, the electronic test system 600 comprises a base 610 and a test head 620, as well as any electronics and other mechanical components necessary to test and discharge the electronic circuit 130. In the representative embodiment of FIG. 6, the base is capable of downward retraction which permits insertion of the electronic circuit 130 between the base 610 and the test head 620. Upward extension of the base forces the electronic circuit 130 into electrical contact with the test head 620 via appropriately placed contacts on the test head 620 and the electronic circuit 130, in which position electronic circuit elements 140 on the electronic circuit 130 can be tested and discharged as necessary and as described above. All or part of the electronic discharge circuit 100 can be placed in the test head 620 in order to reduce interconnect path lengths and increase the operational speed of the test and discharge processes. The test head 620 employs a series of connectors which are placed at predetermined locations to connect with predetermined nodes on the electronic circuit 130 (printed circuit board or other electronic component) so that in-circuit tests and charge removal can be performed on the various electronic circuit elements 140 comprising the electronic circuit 130. The electronic test system 600, which could be an automatic test equipment (ATE) test system 600, could comprise a computer system or state logic device and the associated devices, such as signal generators, voltage supplies, current supplies, comparators, and signal processors for performing the tests.

It will be recognized by one of ordinary skill in the art that the electronic circuit 130 could be a circuit comprised of discrete components, a bare printed circuit board, a loaded printed circuit board, a packaged individual electronic component, an integrated circuit in die form or on a semiconductor wafer, or the like. It will be further recognized that in removing charge from an electronic circuit 130, that the element node 142 and reference node 141 must be accessible for contact by the electronic discharge circuit 100, that the electronic circuit element 140 located between the element node 142 and reference node 141 may comprise multiple electronic devices, and that the choice of which contact points on the electronic circuit 130 are the element node 142 and reference node 141 is determined by the user. Once the charge between a chosen element node 142 and reference node 141 pair has been discharged, that pair can be shorted together by closing an associated fourth switch 165. Then charge from a new element node 142 can be removed using the previous shorted element node 142 and reference node 141 pair. In this manner, charge can be removed in sequence from the remaining accessible nodes (element nodes 142) on the electronic circuit 130. Optionally, in order to increase through-put charge can be removed from multiple electronic circuit elements 140 simultaneously using multiple discharge circuits 100.

An advantage of the embodiments described herein is that stray charge in an electronic circuit 130 can be quickly and automatically removed. Further, representative embodiments are less sensitive to errors in the description of the electronic circuit elements 140 of an electronic circuit 130. The electronic circuit 130 can be a loaded printed circuit board. The discharge circuits 100 described herein are simple to use, both for factory software engineers and for customers. Except for batteries, information regarding the layout of the electronic circuit 130 is not needed in order to write a discharge sequence.

Advantages include a higher throughput. Using a current source rather than a resistor is a faster method for safely discharging a capacitor. There is no need to switch resistors in and out as the charge in the electronic circuit element 140 decreases, so that time for discharging the electronic circuit element 140 is saved in reduced switching.

The discharge current is constant and equal to the peak current for a resistor discharge scheme. Thus, the average discharge current can be higher than with resistor schemes. Necessary training for test personnel and users is reduced. Equipment downtime and repair costs are reduced. Test development time is reduced. Engineering change orders are simpler to implement as changes to the discharge program may be reduced or unnecessary. Warranty and service costs are less. Less code support is required. Training and documentation costs are reduced. Also, there will be a lowered demand on field resources.

Using the diode bridge (first, second, third, and fourth diodes 181,182,183,184) to connect the electronic circuit element 140 to the current sources 110,190 and referencing the other side of the bridge to ground automatically clamps the discharged electronic circuit element 140 to zero volts. Using a current source or current sources provides a simple means for protecting the switch contacts while maintaining a high rate of discharge.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. An electronic discharge circuit for removing charge from an electronic circuit, comprising:
   a first current source having a first current source input and a first current source output;
   a current control circuit having a first, a second, a third, and a fourth control contacts, wherein the electronic circuit comprises an electronic circuit element, wherein the electronic circuit element comprises a first and a second element contacts, wherein when the first control contact is electrically connected to the first current source input, the second control contact is electrically connected to the first current source output, the third control contact is electrically connected to the first element contact, and the fourth control contact is electrically connected to the second element contact, and wherein
   when the electronic circuit element is electronically charged, current discharging the electronic circuit element is limited to the current from the first current source,
   and when the electronic circuit element is uncharged, current discharging the electronic circuit element is zero and current from the first current source flows into the second control contact and out the first control contact.

2. The electronic discharge circuit as recited in claim 1, wherein the electrical connection between the first current source input and the second element contact are electrically connected at a reference contact point and where the reference contact point is at ground potential.

3. The electronic discharge circuit as recited in claim 1, wherein the first current source has capability of outputting a constant current.

4. The electronic discharge circuit as recited in claim 1, further comprising a first switch connected between the first current source input and the first control contact, wherein if the first switch is in its closed position, the first current source input is electrically connected to the first control contact, otherwise, the first switch is in its open position and the first current source input is electrically disconnected from the first control contact.

5. The electronic discharge circuit as recited in claim 1, further comprising a second switch connected between the first current source output and the second control contact, wherein if the second switch is in its closed position, the first current source output is electrically connected to the second control contact, otherwise, the second switch is in its open position and the first current source output is electrically disconnected from the second control contact.

6. The electronic discharge circuit as recited in claim 1, further comprising a third switch connected between the second element contact and the fourth control contact, wherein if the third switch is in its closed position, the second element contact is electrically connected to the fourth control contact otherwise, the third switch is in its open position and the second element contact is electrically disconnected from the fourth control contact.

7. The electronic discharge circuit as recited in claim 6, further comprising a fourth switch connected between the first element contact and the second element contact, wherein if the fourth switch is in its closed position, the first element contact is electrically connected to the second element contact otherwise, the fourth switch is in its open position and the first element contact is electrically disconnected, external to the electronic circuit element, from the second element contact.

8. The electronic discharge circuit as recited in claim 7, further comprising multiple third switches and multiple fourth switches, wherein the electronic circuit comprises multiple electronic circuit elements, wherein each third switch is paired with associated fourth switch, wherein each pair of third and fourth switches is associated with one of the electronic circuit elements, wherein each third switch is connected between the second element contact of the associated electronic circuit element and the fourth control contact, wherein if one of the third switches is in its closed position, the second element contact of the associated electronic circuit element is electrically connected to the fourth control contact otherwise, the third switch is in its open position and the second element contact of the associated electronic circuit element is electrically disconnected from the fourth control contact, wherein each paired fourth switch is connected between the first element contact of the associated electronic circuit element and the second element contact of the associated electronic circuit element, and wherein if the fourth switch of the associated electronic circuit element is in its closed position, the first element contact of the associated electronic circuit element is electrically connected to the second element contact of the associated electronic circuit element otherwise, the fourth switch of the associated electronic circuit element is in its open position and the first element contact of the associated electronic circuit element is electrically disconnected from the second element contact of the associated electronic circuit element.

9. The electronic discharge circuit as recited in claim 1, wherein the current control circuit further comprises a first, a second, a third, and a fourth diodes, wherein anode of the first diode is connected to the second control contact, wherein cathode of the first diode is connected to the third control contact, wherein anode of the second diode is connected to the third control contact, wherein cathode of the second diode is connected to the first control contact, wherein anode of the third diode is connected to the fourth control contact, wherein cathode of the third diode is connected to the first control contact, wherein anode of the fourth diode is connected to the second control contact, and wherein cathode of the fourth diode is connected to the fourth control contact.

10. The electronic discharge circuit as recited in claim 1, further comprising a detection circuit, wherein the detection circuit indicates the charge status of the electronic circuit element.

11. An electronic discharge circuit for removing charge from an electronic circuit, comprising:
   a first current source having a first current source input and a first current source output;
   a second current source having a second current source input and a second current source output;
   a current control circuit having a first, a second, a third, and a fourth control contacts, wherein the electronic circuit comprises an electronic circuit element, wherein the electronic circuit element comprises a first and a second element contacts, wherein when the first current source input is electrically connected to the second current source output, the first control contact is electrically connected to the second current source input, the second control contact is electrically connected to the first current source output, the third control contact is electrically connected to the first element contact, the third control contact is electrically connected to the first current source input, the third control contact is electrically connected to the second current source output, and the fourth control contact is electrically connected to the second element contact, and wherein when the electronic circuit element is positively charged, current discharging the electronic circuit element is limited to the current from the second current source, when if the electronic circuit element is negatively charged, current discharging the electronic circuit element is limited to the current from the first current source, and when the electronic circuit element is uncharged, current discharging the electronic circuit element is zero and current from the first current source flows in a loop into the second control contact, out the first control contact, through the second current source, and back to the first current source.

12. The electronic discharge circuit as recited in claim 11, wherein the electrical connection between the first current source input and the second element contact are electrically connected at a reference contact point and where the reference contact point is at ground potential.

13. The electronic discharge circuit as recited in claim 11, wherein the first current source has capability of outputting a constant current and wherein the second current source has capability of outputting a constant current.

14. The electronic discharge circuit as recited in claim 11, further comprising a first switch connected between the second current source input and the first control contact, wherein if the first switch is in its closed position, the second current source input is electrically connected to the first control contact, otherwise, the first switch is in its open position and the second current source input is electrically disconnected from the first control contact.

15. The electronic discharge circuit as recited in claim 11, further comprising a second switch connected between the first current source output and the second control contact, wherein if the second switch is in its closed position, the first current source output is electrically connected to the second control contact, otherwise, the second switch is in its open position and the first current source output is electrically disconnected from the second control contact.

16. The electronic discharge circuit as recited in claim 11, further comprising a third switch connected between the second element contact and the fourth control contact, wherein if the third switch is in its closed position, the second element contact is electrically connected to the fourth control contact otherwise, the third switch is in its open position and the second element contact is electrically disconnected from the fourth control contact.

17. The electronic discharge circuit as recited in claim 16, further comprising a fourth switch connected between the first element contact and the second element contact, wherein if the fourth switch is in its closed position, the first element contact is electrically connected to the second element contact otherwise, the fourth switch is in its open position and the first element contact is electrically disconnected, external to the electronic circuit element, from the second element contact.

18. The electronic discharge circuit as recited in claim 17, further comprising multiple third switches and multiple fourth switches, wherein the electronic circuit comprises multiple electronic circuit elements, wherein each third switch is paired with associated fourth switch, wherein each pair of third and fourth switches is associated with one of the electronic circuit elements, wherein each third switch is connected between the second element contact of the associated electronic circuit element and the fourth control contact, wherein if one of the third switches is in its closed position, the second element contact of the associated electronic circuit element is electrically connected to the fourth control contact otherwise, the third switch is in its open position and the second element contact of the associated electronic circuit element is electrically disconnected from the fourth control contact, wherein each paired fourth switch is connected between the first element contact of the associated electronic circuit element and the second element contact of the associated electronic circuit element, and wherein if the fourth switch of the associated electronic circuit element is in its closed position, the first element contact of the associated electronic circuit element is electrically connected to the second element contact of the associated electronic circuit element otherwise, the fourth switch of the associated electronic circuit element is in its open position and the first element contact of the associated electronic circuit element is electrically disconnected from the second element contact of the associated electronic circuit element.

19. The electronic discharge circuit as recited in claim 11, wherein the current control circuit further comprises a first, a second, a third, and a fourth diodes, wherein anode of the first diode is connected to the second control contact, wherein cathode of the first diode is connected to the third control contact, wherein anode of the second diode is connected to the third control contact, wherein cathode of the second diode is connected to the first control contact, wherein anode of the third diode is connected to the fourth control contact, wherein cathode of the third diode is connected to the first control contact, wherein anode of the fourth diode is connected to the second control contact, and wherein cathode of the fourth diode is connected to the fourth control contact.

20. The electronic discharge circuit as recited in claim 11, further comprising a detection circuit, wherein the detection circuit indicates the charge status of the electronic circuit element.

* * * * *

UNITED STATES PATENT AND TRADEMARK OFFICE
CERTIFICATE OF CORRECTION

PATENT NO. : 7,132,876 B2
APPLICATION NO. : 11/023893
DATED : November 7, 2006
INVENTOR(S) : Peiffer et al.

It is certified that error appears in the above-identified patent and that said Letters Patent is hereby corrected as shown below:

On the Title page, item 74 in "Primary Examiner", in column 2, line 1, delete "Nuton" and insert -- Nu Ton --, therefor.

Column 15, line 11, in Claim 11, after "when" delete "if".

Signed and Sealed this

Twenty-seventh Day of March, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,132,876 B2 |
| APPLICATION NO. | : 11/023893 |
| DATED | : November 7, 2006 |
| INVENTOR(S) | : Peiffer et al. |

Page 1 of 1

It is certified that error appears in the above-identified patent and that said Letters Patent is hereby corrected as shown below:

On the Title page, item (75), under "Inventors", in column 1, line 2, after "(US)" insert -- ; Dayton Norrgard, Loveland, CO (US) --.

Signed and Sealed this

Tenth Day of July, 2007

JON W. DUDAS
*Director of the United States Patent and Trademark Office*